United States Patent
Wang et al.

(10) Patent No.: US 7,019,979 B2
(45) Date of Patent: Mar. 28, 2006

(54) HEAT DISSIPATING DEVICE HAVING IMPROVED FASTENING STRUCTURE

(75) Inventors: Jack Wang, No.2-3, Hsing-Hua Rd., Taoyuan City 330 (TW); Cheng-Hua Cheng, Taoyuan (TW); Michael Lin, Taoyuan (TW); Charles Ma, Taoyuan (TW)

(73) Assignees: Waffer Technology Corp., Taoyuan (TW); Jack Wang, Taoyuan (TW)

( * ) Notice: Subject to any disclaimer, the term of this patent is extended or adjusted under 35 U.S.C. 154(b) by 298 days.

(21) Appl. No.: 10/717,447

(22) Filed: Nov. 21, 2003

(65) Prior Publication Data

US 2005/0111190 A1 May 26, 2005

(51) Int. Cl.
*H05K 7/20* (2006.01)

(52) U.S. Cl. ............... 361/719; 361/704; 257/718; 174/16.3; 165/80.3

(58) Field of Classification Search ............... 361/687, 361/703, 704, 707, 709, 717–719; 165/80.3, 165/185; 257/718, 719, 722, 727; 248/505, 248/510
See application file for complete search history.

(56) References Cited

U.S. PATENT DOCUMENTS

| 5,713,690 | A | * | 2/1998 | Corbin et al. | 403/270 |
| 5,757,621 | A | * | 5/1998 | Patel | 361/719 |
| 5,880,930 | A | * | 3/1999 | Wheaton | 361/690 |
| 6,545,879 | B1 | * | 4/2003 | Goodwin | 361/807 |
| 6,611,431 | B1 | * | 8/2003 | Lee et al. | 361/719 |

FOREIGN PATENT DOCUMENTS

TW    90211070    12/2002

* cited by examiner

*Primary Examiner*—Boris Chervinsky

(57) ABSTRACT

A fastening structure provided by the present invention is used to fastening a heat dissipating device with a printed circuit board in which a plurality of holes is formed. The fastening structure has a back plate disposed underneath the printed circuit board and a plurality of fitting columns, wherein the back plate is perforated with a plurality of holes and each of the fitting columns has an elongate hollow tube and an insertion member projecting from a periphery of one end of the hollow tube. The hollow tube has a threaded internal sidewall and the insertion member has a shape conformal to the respective holes at which the fitting columns are fixed to the back plate.

15 Claims, 6 Drawing Sheets

HEAT DISSIPATING DEVICE HAVING IMPROVED FASTENING STRUCTURE

BACKGROUND OF THE INVENTION

The present invention relates to a fastening structure of a heat sink, and more particular, to a structure to prevent loose or displacement of a heat sink.

The development of information technology has continuously improved the designs and devices in the computer related industry. The information processed by the related products such as interface cards and central process units (CPU) involved with logic operation becomes larger and larger. Consequently, the operation speeds are faster and faster. The increasing operation speeds results in the elevated temperature during operation. To reduce the heat generated by the high-power devices such as Intel P4 processor or AMD K8 processor, a heat dissipating device with a large volume has been commonly adapted in the industry. The large volume of the heat dissipating inevitably increases the overall weight of the products, such that a higher standard for fastening or mounting the heat dissipating device is demanded.

Taiwanese Patent Application No. 90211070 has disclosed an improvement of a fitting structure of a CPU heat sink. The CPU heat sink is sandwiched between the motherboard and the CPU by fastening screws to prevent the heat sink from loosening away from the CPU due to inadvertent impact. However, this type of heat dissipating device requires a supporting board and a threaded column with a specific design, such that the applicability is very limited.

BRIEF SUMMARY OF THE INVENTION

The present invention provides a heat dissipating device with an improved fastening structure. The fastening structure includes a plurality of through holes such that the heat dissipating device can be attached to the heat dissipating device on various types and sizes of motherboards.

The present invention further provides a heat dissipating device that includes an improved fastening structure. The fastening structure uses fitting columns inserted through holes formed in a back plate and ensures that no relative rotation occurs between fitting plate and the fitting columns, such that the heat dissipating device is stably secured to the back plate.

The fastening structure provided by the present invention is used to fastening a heat dissipating device with a printed circuit board in which a plurality of holes is formed. The fastening structure comprises a back plate disposed underneath the printed circuit board and a plurality of fitting columns, wherein the back plate is perforated with a plurality of holes and each of the fitting columns includes an elongate hollow tube and an insertion member projecting from a periphery of one end of the hollow tube. The hollow tube has a threaded internal sidewall and the insertion member has a shape conformal to the respective holes at which the fitting columns are fixed to the back plate.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

These, as well as other features of the present invention, will become apparent upon reference to the drawings wherein.

DETAILED DESCRIPTION OF THE INVENTION

Figure 1:
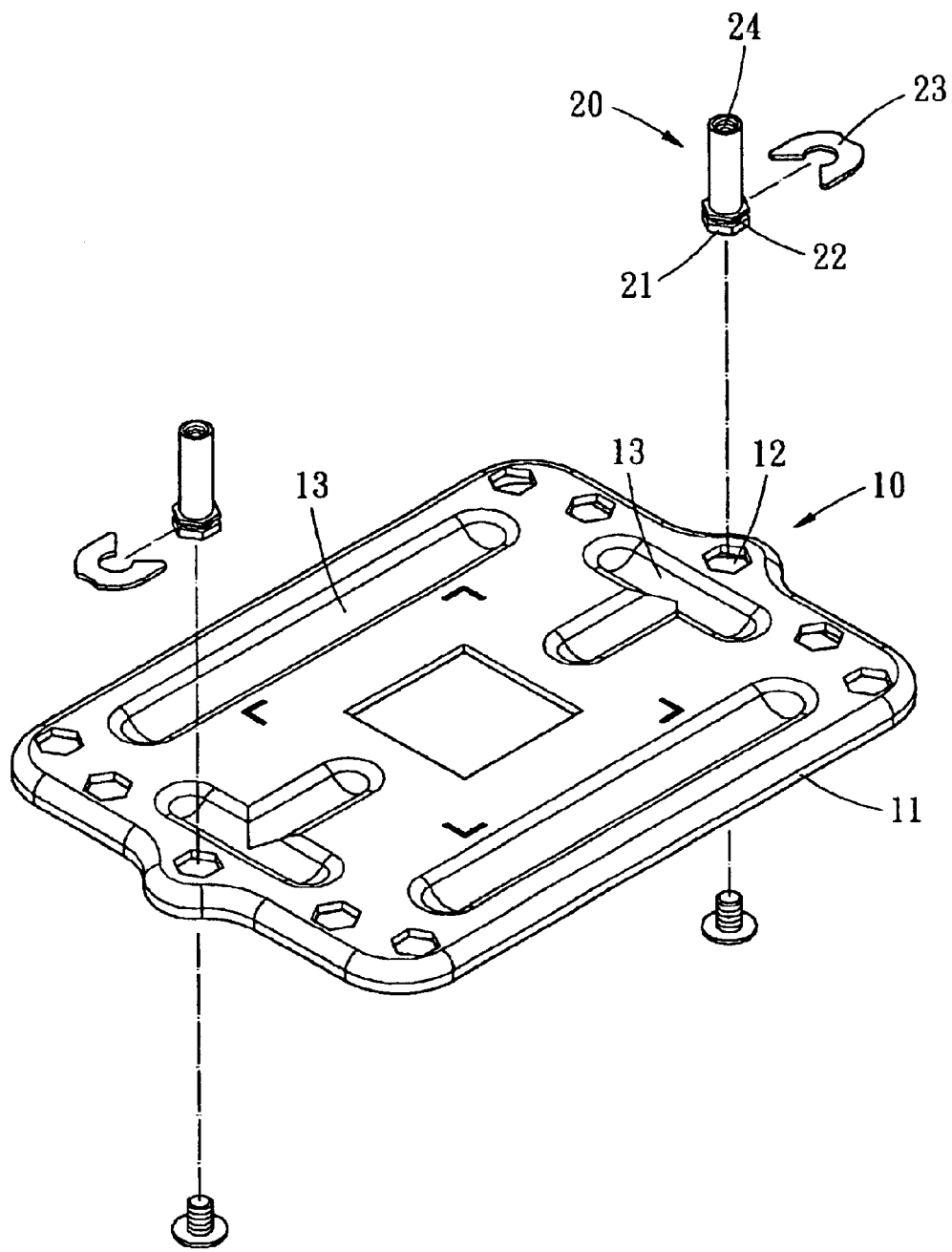
FIG. 1 shows an exploded view of a fastening structure of a heat dissipating device provided by the present invention.

Reference will now be made in detail to the preferred embodiments of the present invention, examples of which are illustrated in the accompanying drawings. Wherever possible, the same reference numbers are used in the drawings and the description to refer to the same or like parts.

Figure 2:
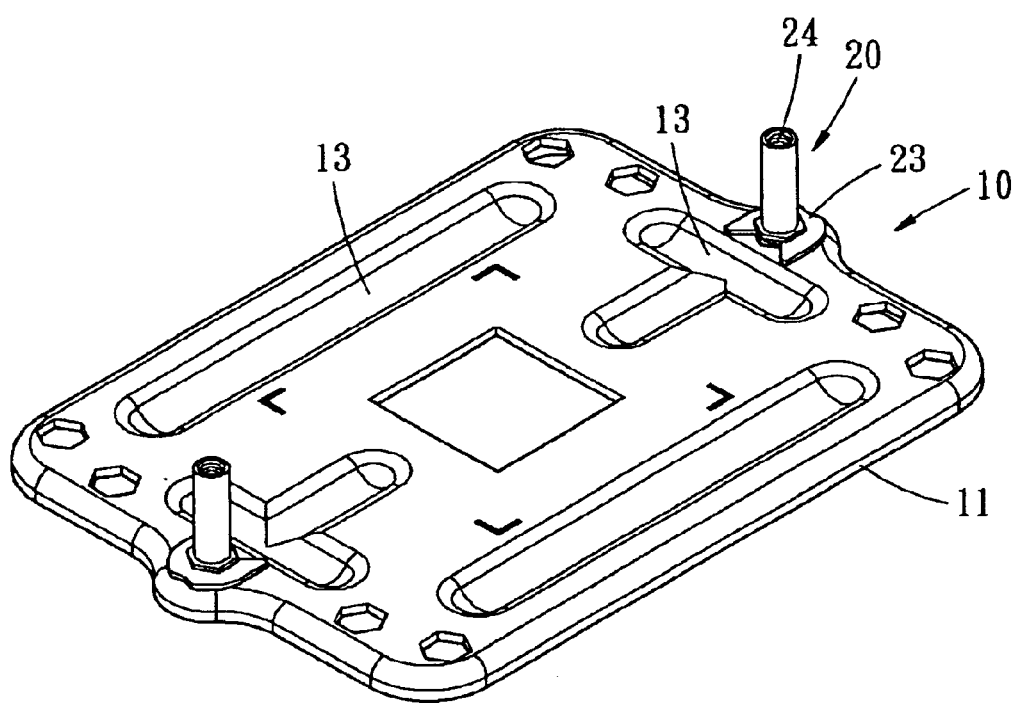
FIG. 2 shows a perspective view of the fastening structure as shown in FIG. 1.

FIGS. 1 and 2 show the exploded view and perspective view of a fastening structure used for fitting a heat sink to a heat generating device. The fastening structure includes a back plate 10 and a plurality of fitting columns 20.

The back plate 10 is fabricated from metal, plastic or other materials. The back plate 10 is placed underneath a motherboard of a computer. In this embodiment, the back plate 10 is substantially rectangular. The back plate 10 includes two elongate slots 13 formed along two elongate sides thereof and two T-shape slots 13 form at two transverse sides between the elongate sides. Between the T-shape slots 13 and the transverse sides, the back plate 10 further includes a plurality of through holes 12. The through holes 12 are hexagonal, rectangular, circular, triangular or other polygonal according to specific requirement.

Preferably, the fitting columns 20 are fabricated from metal materials. Each of the fitting columns 20 includes an elongate tube 24 which has a threaded internal surface and an insertion member 21 projecting from the periphery of a lower end of the elongate tube 24. The elongate tube 24 is hollow and has two opening ends. The insertion member 21 includes a groove 22 recessed from a periphery thereof. The insertion member 21 is configured conformal to the through holes 12 formed in the back plate 10.

Each of the fitting columns 20 further comprises an open washer 23 to be inserted into the groove 22 of the insertion member 21. Therefore, when the insertion members 21 are disposed in the though holes 12, the washers 23 hold the majority part of the fitting columns 20 over the back plate 10, while the attachment between the fitting columns 20 and the back plate 10 can be reinforced by screw members threaded into the lower ends of the fitting columns 20.

Figure 3:
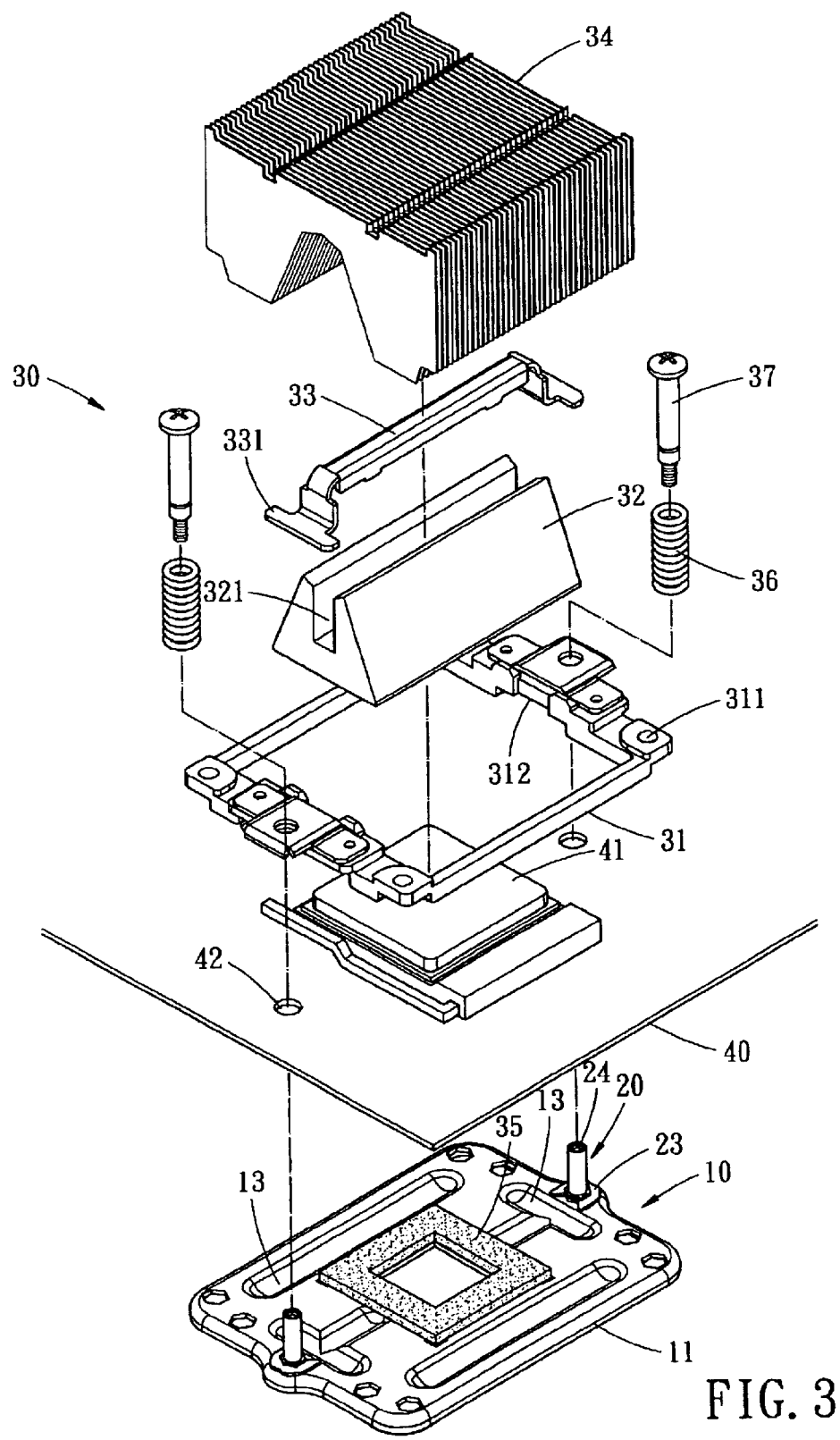
FIG. 3 shows an exploded view of applying the fastening structure as shown in FIG. 1 to a heat sink.
Figure 4:
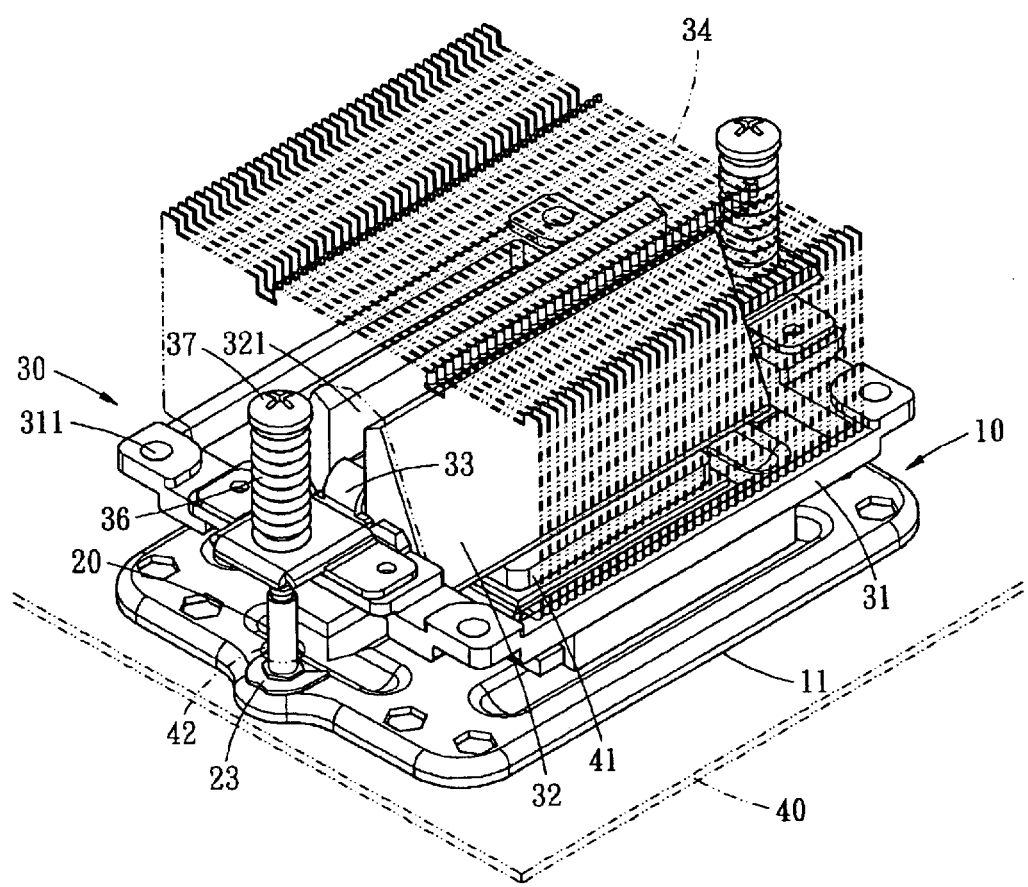
FIG. 4 shows a perspective view of the application as shown in FIG. 3.
Figure 5:
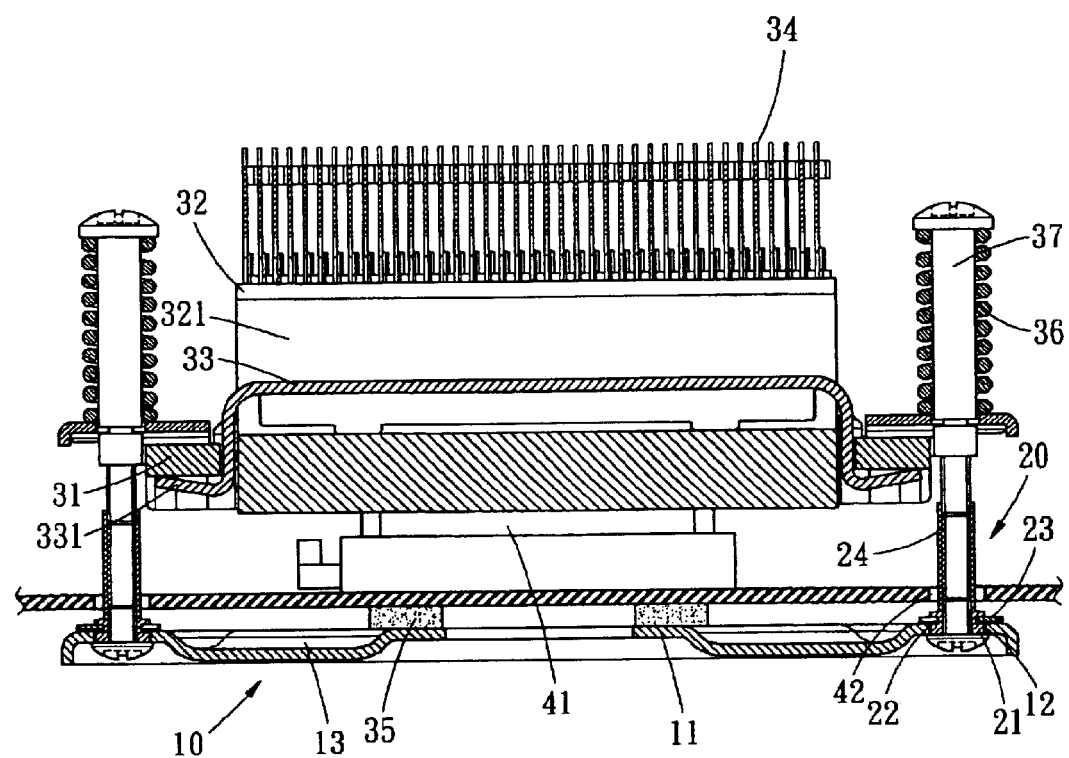
FIG. 5 shows another embodiment of the fitting column as shown in FIG. 1.

FIGS. 3 to 5 shows the application of the fastening structure as described above to a heat dissipating device 30 which is to be mounted on a heat generating device 41 on a printed circuit board 40. As shown, the printed circuit board 40 is sandwiched between the heat dissipating device 30 and the back plate 10. The printed circuit board 40 is perforated with at least two holes 42. The holes 42 are aligned with two through holes 12 formed along transverse sides of the back plate 10 allowing the fitting columns 20 fixed in the through holes 12 to penetrate through. The heat dissipating device 30 includes a frame 31, a thermal conductive block 32, a bracket 33 and a heat sink 34. The frame 31 is perforated with a central aperture 312 for accommodating the heat generating device 30 therein while being placed on the printed circuit board 40. Similar to the back plate 10, the frame 31 is substantially rectangular and has two transverse sides perforated with a plurality of through holes 311. The through holes 311 are aligned with the holes 42 formed in the printed circuit board 40 and the through holes 12 formed in the back plate 10. Therefore, the elongate tubes 24 can extend through to secure the printed circuit board 40 between the frame 31 and the back plate 10 by screw members 37 threaded into the upper ends of the fitting columns 20. Preferably, resilient members 36 such as springs are inserted between the heads of the screw members 37 and the printed circuit board 40.

The thermal conductive block 32 is placed on top of the heat generating device 41 within the frame 31. The thermal conductive block 32 is preferably formed of materials with good conductivity such as aluminum or copper, for example. As shown, the top surface of the thermal conductive block 32 is recessed to form a channel 321 extending across the top surface along an elongate direction of the thermal conductive block 32. The bracket 33 includes a central elongate member and two T-shape bracket members 331 extending from two opposing ends of the central elongate member. The central elongate member can be inserted into the channel 321 and is sufficiently long such that when the central elongate member is inserted in the channel 321, the T-shape bracket members 331 protrude from two longitudinal sides of the thermal conductive block 32. By overlaying the transverse sides of the frame 31 on top of the T-shape bracket members 331 and fastening the frame 31 to the printed circuit board 41 and the back plate 10, the thermal conductive block 32 is securely mounted to the heat generating device 41.

As shown in FIG. 3, the fastening structure may further comprises a shock absorbing member 35 such as a layer of foam or sponge between the back plate 10 and the printed circuit board 40. The cross section of the heat sink 34 is substantially rectangular. The lower surface of the heat sink 34 is recessed to form a channel conformal to the cross section of the thermal conductive block 32, such that the heat sink 34 can be place across the thermal conductive block 32. The lower corners of two lateral sides of the heat sink 34 are preferably removed, such that the lower portion of the heat sink 34 can be inserted into the frame 31.

Figure 6:
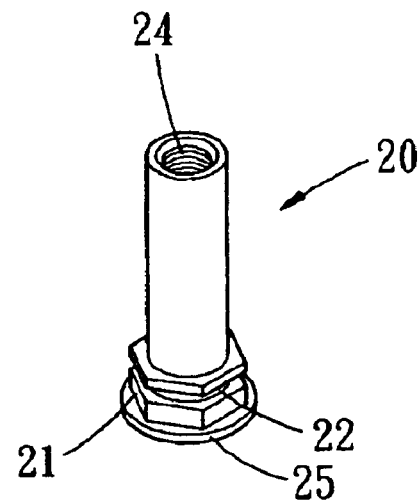
FIG. 6 shows another modification of the fitting column.
Figure 7:
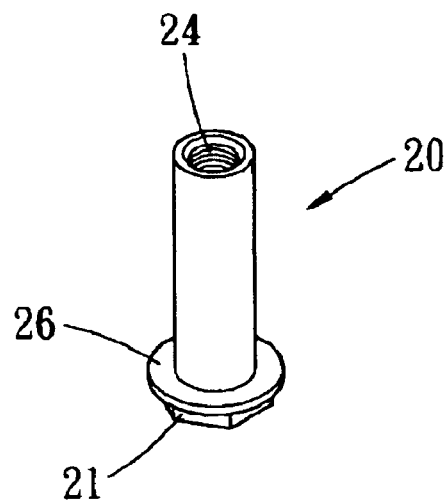
FIG. 7 shows still another modification of the fitting column.

As shown in FIGS. 6–7, the fitting columns 20 may further comprise bottom lids 25 as shown in FIG. 6. The outer diameter of the bottom lids 25 is larger than the diameter of the holes 12 formed in the back plate, such that a blocking effect can be achieved. Similarly, as shown in FIG. 7, a top lid may also be inserted on the insertion members 21 to achieve the holding effect similar to the washers 23 as shown in FIG. 1.

The heat dissipating device and the fastening structure provided by the present invention has at least the following advantages.

1. Various types of through holes are formed in the back plate, such that the fastening structure is operative to secure the heat dissipating device to printed circuit boards with various configuration and sizes.
2. The fitting columns are fixed to the back plate to avoid a relative rotation between the fitting columns and the back plate. Therefore, the heat dissipating device is stably attached to the printed circuit board.
3. The printed circuit board and the heat generating device is sandwiched between the heat dissipating device and the back plate, such that damage of the printed circuit board and the heat generating device caused by impact is minimized.

This disclosure provides exemplary embodiments of the present invention. The scope of this disclosure is not limited by these exemplary embodiments. Numerous variations, whether explicitly provided for by the specification or implied by the specification, such as variations in shape, structure, dimension, type of material or manufacturing process may be implemented by one of skill in the art in view of this disclosure.

What is claimed is:

1. A fastening structure used to fastening a heat dissipating device with a printed circuit board in which a plurality of holes is formed, the fastening structure comprising a back plate disposed underneath the printed circuit board and a plurality of fitting columns, wherein the back plate is perforated with a plurality of holes and the fitting columns each includes an elongate hollow tube and an insertion member projecting from a periphery of one end of the hollow tube, the hollow tube has a threaded internal sidewall and the insertion member has a shape conformal to the respective holes at which the fitting columns are fixed to the back plate.

2. The structure of claim 1, wherein the back plate is fabricated from metal or plastic material.

3. The structure of claim 1, wherein the holes are hexagonal or rectangular.

4. The structure of claim 1, wherein the back plate includes a plurality of slots formed along a periphery thereof.

5. The structure of claim 4, wherein the slots includes a pair of T-shape slots formed at two opposing sides of the periphery.

6. The structure of claim 1, wherein the fitting columns are formed of metal material.

7. The structure of claim 1, wherein the insertion member of each fitting column includes a groove recessed from a periphery thereof.

8. The structure of claim 7, further comprising a washer to be inserted into the groove, the washer has a diameter larger than that of the insertion member.

9. The structure of claim 1, further comprising a bottom lid attached to a bottom of each insertion member, the bottom lid has a diameter larger than that of the insertion member.

10. The structure of claim 1, further comprises screw members to fasten the fitting columns with the back plate.

11. The structure of claim 1, wherein the heat dissipating device is mounted on the printed circuit board such that the printed circuit board is sandwiched by the heat dissipating device and the back plate.

12. The structure of claim 11, wherein the heat dissipating device includes a frame with a perforation placed on the printed circuit board, a thermal conductive block placed aligned over the perforation, a bracket having a central member place on the thermal conductive block and two bracket members extending from the central member to be placed between a periphery of the frame and the printed circuit board, and a heat sink disposed across the thermal conductive block.

13. The structure of claim 12, wherein the periphery of frame is perforated with holes allowing the fitting columns to extend therethrough.

14. The structure of claim 12, further comprises a plurality of screw members to fasten the fitting columns with the frame.

15. The structure of claim 14, further comprises a plurality of resilient members between the frame and heads of the screw members.

* * * * *